US010181421B1

(12) United States Patent
Ryan et al.

(10) Patent No.: US 10,181,421 B1
(45) Date of Patent: Jan. 15, 2019

(54) LINER RECESS FOR FULLY ALIGNED VIA

(71) Applicant: GLOBALFOUNDRIES Inc., Grand Cayman (KY)

(72) Inventors: Errol Todd Ryan, Clifton Park, NY (US); Sean Xuan Lin, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 44 days.

(21) Appl. No.: 15/647,977

(22) Filed: Jul. 12, 2017

(51) Int. Cl.
*H01L 21/768* (2006.01)
*H01L 23/522* (2006.01)
*H01L 23/532* (2006.01)
*H01L 23/528* (2006.01)

(52) U.S. Cl.
CPC .. *H01L 21/76897* (2013.01); *H01L 21/76802* (2013.01); *H01L 21/76834* (2013.01); *H01L 21/76877* (2013.01); *H01L 23/528* (2013.01); *H01L 23/5226* (2013.01); *H01L 23/53238* (2013.01)

(58) Field of Classification Search
CPC ............... H01L 23/522; H01L 23/5226; H01L 21/76802; H01L 21/76831; H01L 21/76832; H01L 21/76834; H01L 21/76897; H01L 21/76841; H01L 21/76843; H01L 21/76877; H01L 21/76849; H01L 21/7685; H01L 21/76865; H01L 21/76892
See application file for complete search history.

(56) References Cited

U.S. PATENT DOCUMENTS

| | | | | |
|---|---|---|---|---|
| 6,680,540 | B2* | 1/2004 | Nakano | H01L 21/288 257/758 |
| 2001/0030366 | A1* | 10/2001 | Nakano | H01L 21/288 257/758 |
| 2005/0191851 | A1* | 9/2005 | Liu | H01L 21/76805 438/634 |
| 2005/0206002 | A1* | 9/2005 | Nitta | H01L 21/32134 257/758 |
| 2006/0240597 | A1* | 10/2006 | Abe | H01L 21/76834 438/118 |
| 2013/0078798 | A1* | 3/2013 | Sun | H01L 21/823871 438/643 |
| 2013/0178033 | A1* | 7/2013 | Bohr | H01L 21/76831 438/299 |

(Continued)

*Primary Examiner* — Scott B Geyer
(74) *Attorney, Agent, or Firm* — Heslin Rothenberg Farley & Mesiti P.C.; Nathan B. Davis

(57) ABSTRACT

Devices and methods of fabricating devices are provided. One method includes: obtaining an intermediate semiconductor device having a dielectric layer, an insulating layer, and a plurality of metal lines, including a liner material and a first metal material; recessing the metal material of each metal line forming a set of cavities; filling the cavities with a protective cap; etching the protective cap and the liner material in the set of cavities; depositing a plurality of dielectric caps in the set of cavities; depositing an interlayer dielectric layer over the insulating layer and the plurality of dielectric caps; patterning a via in the interlayer dielectric layer; and depositing a lining and a second metal material in the interconnect area; wherein the second metal material is electrically insulated from the first metal in at least one of the plurality of metal lines.

15 Claims, 4 Drawing Sheets

(56) References Cited

U.S. PATENT DOCUMENTS

| | | | |
|---|---|---|---|
| 2016/0240485 A1* | 8/2016 | Zhu | H01L 21/82382 |
| 2016/0254185 A1* | 9/2016 | Ryan | H01L 21/76877 257/774 |
| 2017/0053868 A1* | 2/2017 | Lin | H01L 23/5226 |

* cited by examiner

LINER RECESS FOR FULLY ALIGNED VIA

FIELD OF THE INVENTION

The present invention relates to devices and methods of making devices with a recessed liner, and more particularly, to an intermediate semiconductor device with a recessed liner in a set of metal lines.

BACKGROUND

For microstructures, especially integrated circuits, as the devices continue to shrink in size, the insulation of metal lines adjacent or near each other continues to become more difficult to achieve. As the feature size reduces, metal lines and/or metallization vias begin to short, or at minimum create leakage paths between them. Often a metal line from above must contact one metal line below but not the near or adjacent metal lines, and sufficient insulation becomes problematic.

Therefore, it may be desirable to develop devices and methods of forming devices which allow for contact to one metal line while insulating adjacent metal line(s).

BRIEF SUMMARY

The shortcomings of the prior art are overcome and additional advantages are provided through the provisions, in one aspect, a method that includes, for instance: obtaining an intermediate semiconductor device having a dielectric layer, an insulating layer, and a plurality of metal lines, the metal lines including a liner material and a first metal material; recessing the metal material of each metal line forming a set of cavities; filling the cavities with a protective cap; etching the protective cap and the liner material in the set of cavities; depositing a plurality of dielectric caps in the set of cavities; depositing an interlayer dielectric layer over the insulating layer and the plurality of dielectric caps; patterning an interconnect area in the interlayer dielectric layer; and depositing a lining and a second metal material in the interconnect area forming a via; wherein the second metal material is electrically insulated from the first metal in at least one of the plurality of vias.

In another aspect, an intermediate semiconductor device includes, for instance: a dielectric layer; an insulating layer over the dielectric layer; a plurality of metal lines, the metal lines including a liner material and a first metal material, wherein the liner material does not extend to a top surface of the insulating layer; a dielectric cap over at least one of the plurality of metal lines, the dielectric cap having a top surface level with the top surface of the insulating layer; an interlayer dielectric layer over the insulating layer and the dielectric cap; an interconnect area in the interlayer dielectric layer and over the plurality of metal lines, the interconnect region including a lining and a second metal material; and at least one metal line of the plurality of metal lines being electrically connected to the interconnect area and forming a via; wherein the second metal material is electrically insulated from the first metal in at least one of the plurality of vias by the dielectric cap.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are intermediate semiconductor devices and methods of fabricating intermediate semiconductor devices. Advantageously, a first metal material and a second metal material are electrically isolated from one another.

Figure 1:
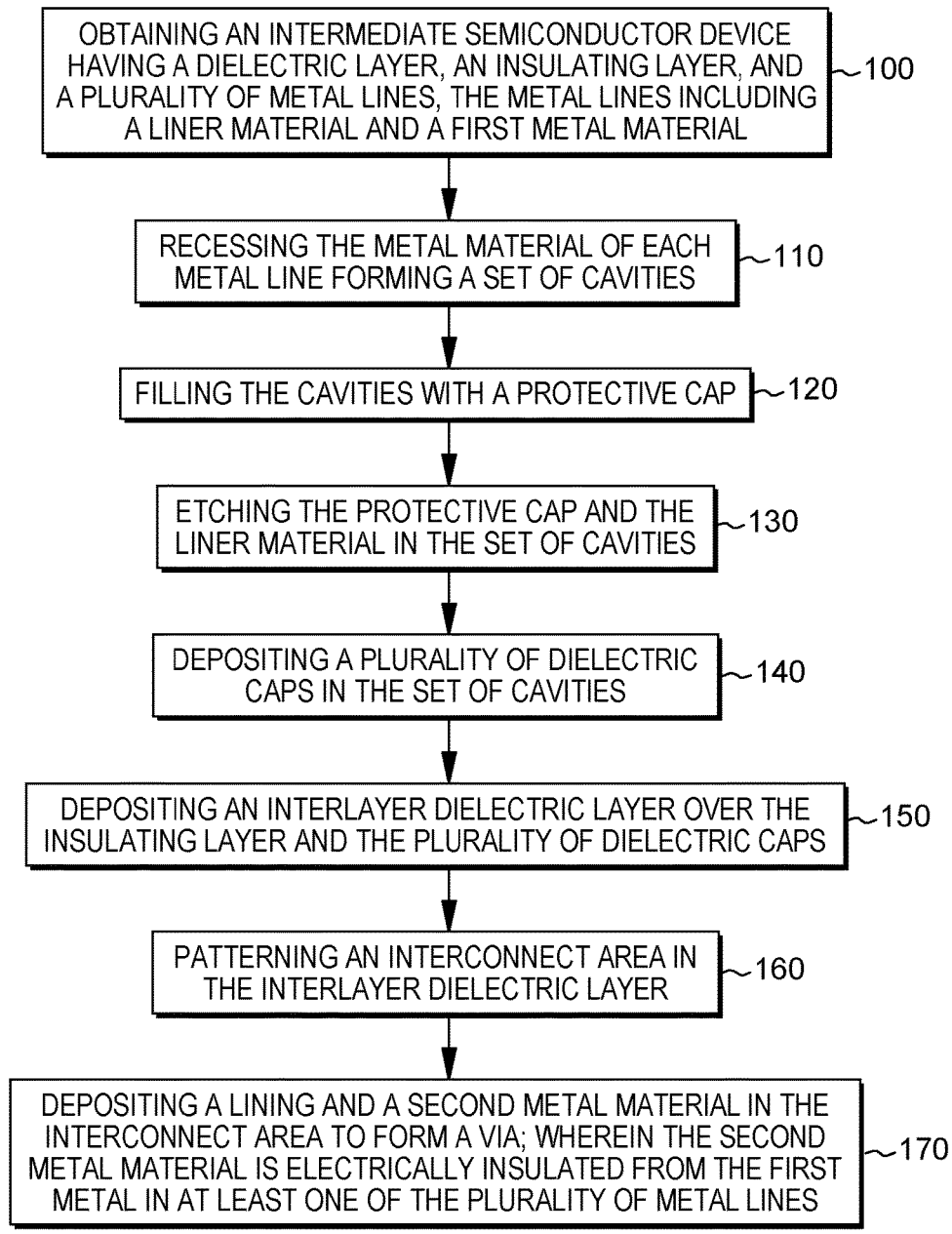
FIG. 1 depicts one embodiment of a method of fabricating a device, in accordance with one or more aspects of the present invention.

In one aspect, in one embodiment, as shown in FIG. 1, a method of analyzing a thin film may include obtaining an intermediate semiconductor device having a dielectric layer, an insulating layer, and a plurality of metal lines, the metal lines including a liner material and a first metal material 100; recessing the metal material of each metal line forming a set of cavities 110; filling the cavities with a protective cap 120; etching the protective cap and the liner material in the set of cavities 130; depositing a plurality of dielectric caps in the set of cavities 140; depositing an interlayer dielectric layer over the insulating layer and the plurality of dielectric caps 150; patterning an interconnect area in the interlayer dielectric layer 160; depositing a lining and a second metal material in the interconnect area 170 forming a via, wherein the second metal material is electrically insulated from the first metal in at least one of the plurality of metal lines.

FIGS. 2A-2H depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2A:
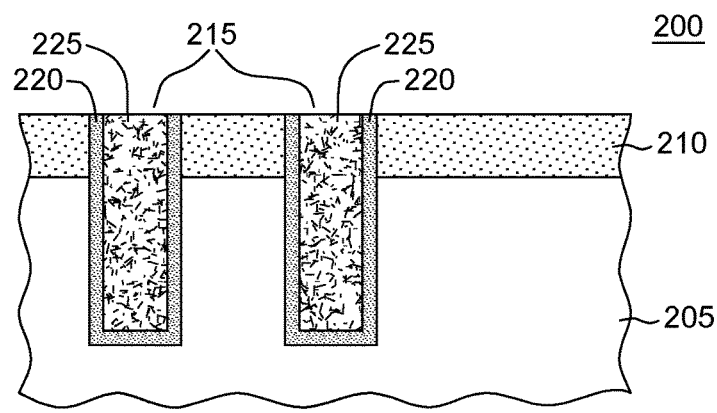
FIGS. 2A-2H depicts a cross-sectional elevation view of one embodiment of an intermediate semiconductor device and methods for fabricating an integrated circuit having recessed liner material and a first metal material electrically insulated from a second metal material, in accordance with one or more aspects of the present invention.

FIG. 2A shows a portion of an intermediate semiconductor device generally denoted 200, depicted at an intermediate semiconductor fabrication stage. In these embodiments and as illustrated, device 200 can include interconnect structures formed, for instance, during back-end-of-line (BEOL) processing techniques. The device 200 may have been processed through initial device processing steps in accordance with the design of the device 200 being fabricated. For example, the device 200 may include, for instance, a dielectric layer 205, which may include any material with a smaller dielectric constant (k) than silicon dioxide. This layer can act as a substrate, or may be deposited on a substrate (not shown). Dielectric layer 205 can include any dielectric materials, including but not limited to any inorganic dielectric materials, organic dielectric materials, or combinations thereof. Suitable dielectric materials can include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). In some embodiments, dielectric materials include organic polymeric thermoset materials, consisting essentially of carbon, oxygen, and hydrogen. Additionally, dielectric materials may include the low-k polyarylene ether polymeric material known as SiLK™ (available from The Dow Chemical Company), and the low-k polymeric material known as FLARE™ (available from Honeywell).

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC).

Still referring to FIG. 2A, above the dielectric layer 205 may be an insulating layer 210. Insulating layer 210, can include a hardmask, which may include SiN, SiCNH, oxide, or similar hardmask materials. Extending through the insulating layer 210 and into the dielectric layer 205 may be a set of metal lines 215, which may include metal line contacts. Thus, the set of metal lines 215 can include a liner material 220 deposited, for instance, by physical vapor deposition (PVD), atomic layer deposition (ALD), or another suitable method of lining vias 215. The liner material 220 can include tantalum nitride or other similar materials. The set of metal lines 215 may also be filled with a first metal material 225, which can include copper in one embodiment, or any other suitable material which is conductive. The first metal material 225 may have been deposited by electroless deposition, physical vapor deposition, chemical vapor deposition, or electroplating techniques.

Figure 2B:
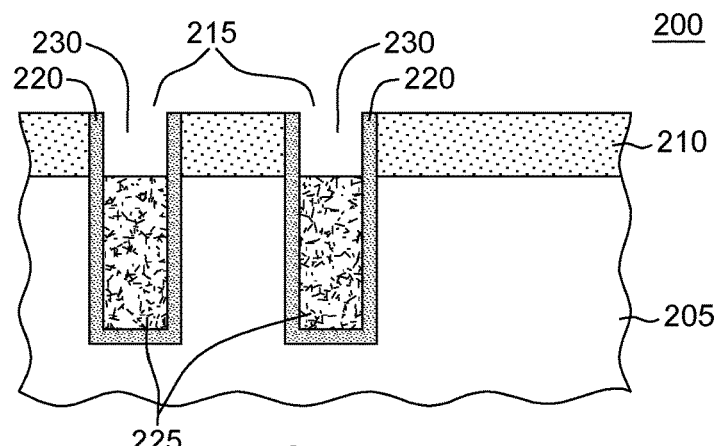

As depicted in FIG. 2B, the first metal material 225 may be recessed. For instance, a selective wet etch may be used which is capable of recessing the first metal material 225 while not etching the liner material 220, forming a set of cavities 230 in the set of metal lines 215.

Figure 2C:
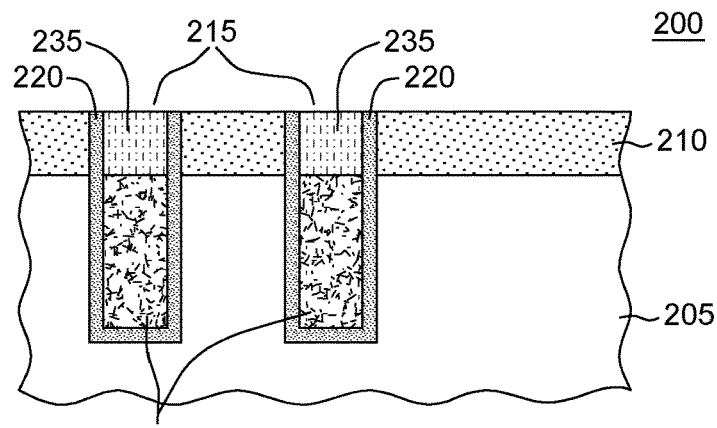

As depicted in FIG. 2C, the set of cavities 230 may be filled with a protective cap 235. The protective caps 235 can include an electroless metal, including but not limited to cobalt, nickel, chromium, silver, and a combination thereof, which can protect the underlying first metal material 225 during etching of the liner material 220. The electroless metal grows selectively on the first metal material 225, for instance copper, and not on the liner material 220, in order to fill the set of cavities 230 without any voiding defects. The specific material of protective cap 235 is chosen based on the material of the liner material 220 and its respective etch rate, as described in more detail below. Protective caps 235 may also include a selective chemical vapor deposition (CVD) material. In some embodiments, the protective caps 235 may be deposited by any now known or later developed deposition techniques, and polished, for instance by chemical mechanical polishing (CMP).

Figure 2D:
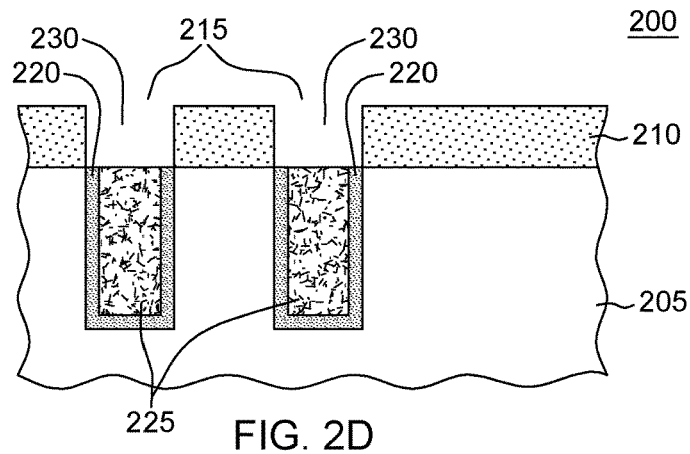

As depicted in FIG. 2D, the liner material 220 and the protective cap 235 in each of the cavities 230 may be etched substantially simultaneously, removing the liner material 220 which could cause a short or leak later in the device after further processing. The material of the protective cap 235 may change the etch behavior of liner material 220 from galvanic couple effect. For example, a silver cap could make the liner material easier to etch because silver thermodynamically is more noble than the liner material. In some embodiments, the protective cap 235 and the liner material 220 may have approximately the same etch rate, such that both are removed via the same etch, for instance a wet etch, for instance a mixture containing hydrogen peroxide, at approximately the same rate. In these embodiments, the depth of the etch is chosen for both materials and carried out simultaneously. In another embodiment, the protective cap 235 may have a higher etch rate than the liner material 220. In these embodiments, during the etching process, the protective cap 235 will be removed at a faster rate than the liner material 220. In some embodiments, the cavity 230 may be filled a second time with the material of the protective cap 235, and a second etching process carried out to remove both materials. This can be repeated multiple times until the proper depth of the etch is achieved. In another embodiment, the protective cap 235 may have a lower etch rate than the etch rate of the liner material 220. In these embodiments, some of the protective cap 235 may remain after the liner material 220 is etched to a desired height. The remaining protective cap 235 material may be removed using a wet etch, for instance a hydrofluoric acid (HF) etch without damaging the first metal material 225. In some embodiments, all of the liner material 220 is removed. In an alternative embodiment, only a portion of liner material 220 is removed, but the remaining liner material 220 is entirely below a top surface of the insulating layer 210, such that no portion of the remaining liner material 220 can contact any layers above the insulating layer 210.

Figure 2E:
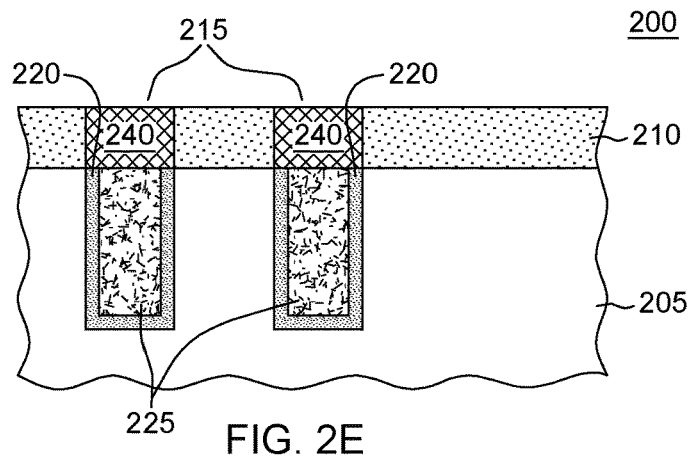

As depicted in FIG. 2E, a plurality of dielectric caps 240 may be deposited in the cavities 230, which are partially or completely empty following the etching. The dielectric caps 240 can include any dielectric material or oxide material and may be deposited using chemical vapor deposition (CVD), atomic layer deposition (ALD), or plasma-enhanced chemical vapor deposition (PECVD), and can consist of more than one layer and more than one material. Following deposition of the plurality of ILD caps 240, a top surface of the device may be polished, for instance by chemical mechanical polishing (CMP).

Figure 2F:
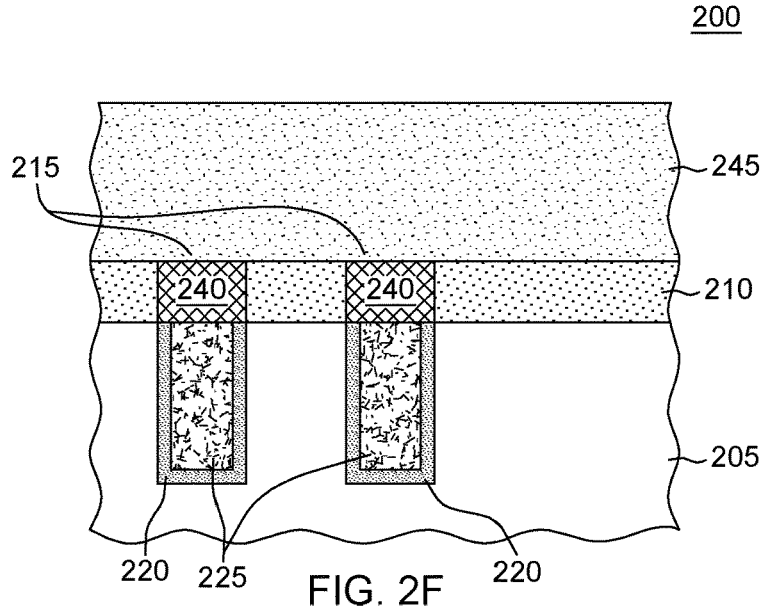

As depicted in FIG. 2F, an interlayer dielectric (ILD) layer 245 may be deposited over the insulating layer 210 and the plurality of dielectric caps 240. The ILD layer 245 can include any dielectric material including ultra low-k (ULK) materials, and can consist of more than one layer and more than one material.

Figure 2G:
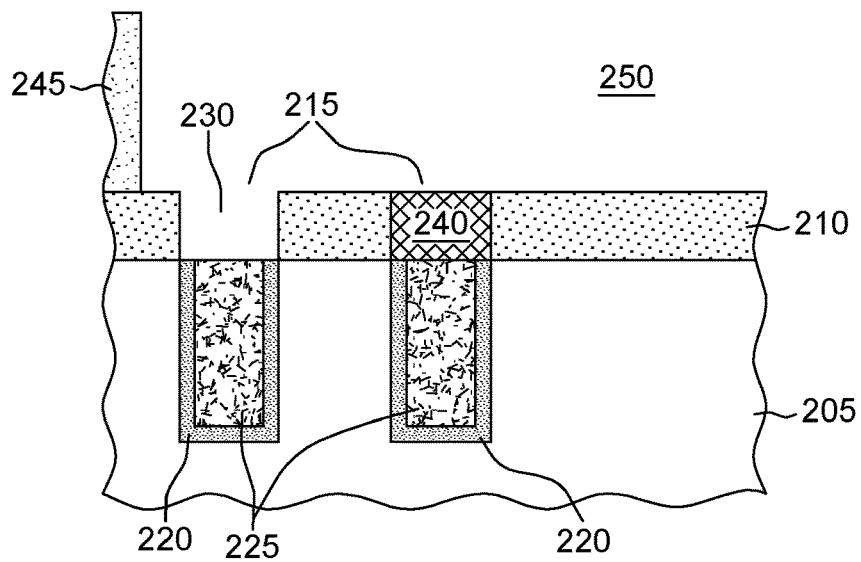

As depicted in FIG. 2G, an interconnect area 250 may be patterned in the ILD layer 245. The interconnect area 250 can be of any shape to form an interconnect, or via, in some instances to at least one of the plurality of metal lines 215, while being electrically insulated from at least one adjacent metal line, so as to prevent a via from forming. Patterning can include any now known or later developed method of patterning, including but not limited to photolithography techniques. In some embodiments, the patterning includes removing at least a portion of the ILD layer 245 and a dielectric cap 240 of at least one metal line 215.

Figure 2H:
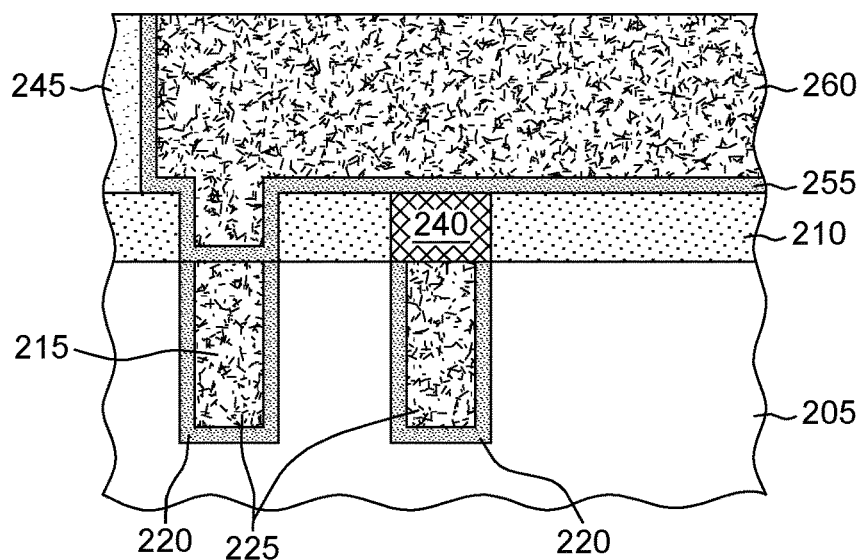

As depicted in FIG. 2H, an optional lining 255 and a second metal material 260 may be deposited in the interconnect area 250. For instance, the lining 255 may be deposited conformally along the exposed surface in the interconnect area 250 by PVD or ALD, or any similar conformal deposition technique. The second metal material 260, which may be the same as first metal material 225, or which may include any other conductive material, may be deposited by any metallization technique, including but not limited to electroplating. As seen in FIG. 2H, at least one adjacent metal line 215 is completely electrically insulated and isolated from the second metal material 260, and from the metal line electrically connected to the second metal material 260. Thus, shorts may be eliminated in BEOL interconnect devices previously caused by the proximity of the liner to the second metal material. Additionally, leakage paths may be reduced or eliminated, which previously caused time dependent dielectric breakdown (TDDB) failures, by forming a via in the interconnect region but isolating adjacent metal lines.

Still referring to FIG. 2H, an intermediate semiconductor device 200 can include a dielectric layer 205, in some embodiments disposed above a substrate (not shown), an insulating layer 210 over the dielectric layer 205, and a plurality of metal lines 215, which include a liner material 220, which does not extend to a top surface of the insulating layer 210, and a first metal material 225, which extend through the insulating layer 210 and into the dielectric layer 205. Disposed over the liner material 220 and first metal material 225 of at least one metal line 215 is a dielectric cap 240, which has a top surface approximately equal with a top surface of the insulating layer 210. Above a portion of the insulating layer 210 is an ILD layer 245. Adjacent to the ILD layer 245 and over the plurality of metal lines 215 is an interconnect area 250, which includes a lining 255 and a second metal material 260, which is electrically connected to at least one metal lines of the plurality of metal lines 215, forming a via to the connected metal line and electrically insulated from the first metal 225 of at least one of the metal lines by virtue of the dielectric cap 240 and the recessed liner material 220. In some embodiments, the first metal material 225 includes copper, and the second metal material 260 may be the same material, as the first metal material 225. In some embodiments, the liner material 220 extends to a top surface of the dielectric layer 205, creating a large gap for efficient insulation. In some embodiments, the liner 255 and the second metal material 260 extend into a cavity over the at least one metal lines below a top surface of the insulating material 210, creating an electrical contact to the at least one metal line, creating an interconnect or via between the metal line 215 and the second metal 260.

Thus, using embodiments described above, by recessing the liner material in the metal lines, shorts may be eliminated in BEOL interconnect devices which were previously caused by the proximity of the liner material to the second metal material. Additionally, leakage paths may be reduced or eliminated, which can cause time dependent dielectric breakdown (TDDB) failures. This allows for smaller features to be fabricated, shrinking the size of BEOL interconnect structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor device having a dielectric layer, an insulating layer, and a plurality of metal lines, the metal lines including a liner material and a first metal material;
   recessing the metal material of each metal line forming a set of cavities;
   filling the cavities with a protective cap;
   etching the protective cap and the liner material in the set of cavities;
   depositing a plurality of dielectric caps in the set of cavities;
   depositing an interlayer dielectric layer over the insulating layer and the plurality of dielectric caps;
   patterning an interconnect area in the interlayer dielectric layer; and
   depositing a second metal material in the interconnect area to form a via;

wherein the second metal material is electrically insulated from the first metal in at least one of the plurality of metal lines.

2. The method of claim 1, wherein the first metal material comprises copper.

3. The method of claim 1, wherein the protective cap comprises an electroless metal or a selective chemical vapor deposition material.

4. The method of claim 3, wherein an etch rate of the electroless metal and an etch rate of the liner material are approximately equal.

5. The method of claim 3, wherein an etch rate of the electroless metal is higher than an etch rate of the liner material.

6. The method of claim 5, further comprising:
filling the cavities a second time with the electroless metal; and
etching the electroless metal and the remaining lining material in the set of cavities.

7. The method of claim 3, wherein an etch rate of the electroless metal is lower than an etch rate of the liner material.

8. The method of claim 7, further comprising:
removing a remaining portion of the protective cap following the etching.

9. The method of claim 8, wherein the removing comprises a wet etch.

10. The method of claim 9, wherein the wet etch comprises a hydrofluoric acid or a hydrogen peroxide mixture.

11. The method of claim 3, wherein the electroless metal comprises cobalt, nickel, chromium, silver, or a combination thereof.

12. The method of claim 1, wherein patterning includes removing a portion of the interlayer dielectric layer and the dielectric cap of at least one metal line of the set of metal lines.

13. The method of claim 12, wherein the second metal material is the same metal as the first metal material.

14. The method of claim 1, wherein the etching removes the entirety of the liner material.

15. The method of claim 1, wherein the etching removes only a portion of the liner material such that the liner material is entirely below a top surface of the insulating layer.

* * * * *